United States Patent
Robertson et al.

(10) Patent No.: US 9,144,171 B2
(45) Date of Patent: *Sep. 22, 2015

(54) APPARATUS FOR SPLIT WIRE ROUTING IN A BRACKET FOR A DEVICE

(71) Applicant: Nook Digital, LLC, New York, NY (US)

(72) Inventors: Karla Robertson, Woodside, CA (US); Nina Joshi, Saratoga, CA (US)

(73) Assignee: Nook Digital, LLC, New York, NY (US)

( * ) Notice: Subject to any disclaimer, the term of this patent is extended or adjusted under 35 U.S.C. 154(b) by 248 days.

This patent is subject to a terminal disclaimer.

(21) Appl. No.: 13/749,264

(22) Filed: Jan. 24, 2013

(65) Prior Publication Data

US 2014/0204547 A1     Jul. 24, 2014

(51) Int. Cl.

| | |
|---|---|
| *H02B 1/01* | (2006.01) |
| *H05K 7/14* | (2006.01) |
| *G06F 1/16* | (2006.01) |
| *H01M 2/20* | (2006.01) |
| *G06F 1/18* | (2006.01) |
| *H01M 10/42* | (2006.01) |

(52) U.S. Cl.
CPC ............ *H05K 7/1417* (2013.01); *G06F 1/1613* (2013.01); *G06F 1/189* (2013.01); *H01M 2/202* (2013.01); *H01M 10/425* (2013.01)

(58) Field of Classification Search
CPC .. H05K 7/1417; H01M 2/202; H01M 10/425; H01M 2/20; H01M 2/204; H01M 2/22; H01M 2/24; H01M 2/1061; H01M 2/1066; G06F 1/1613

USPC ............... 361/826, 827, 825; 429/7, 159, 16; 174/72 A

See application file for complete search history.

(56) References Cited

U.S. PATENT DOCUMENTS

| | | | |
|---|---|---|---|
| 3,659,319 A | | 5/1972 | Erickson |
| 3,836,415 A | * | 9/1974 | Hilderbrandt ................. 156/181 |
| 5,601,942 A | | 2/1997 | Fedele |

(Continued)

OTHER PUBLICATIONS

Robertson, et al., U.S. Appl. No. 13/749,257, filed Jan. 24, 2013, entitled, "Techniques for Split Wire Routing for a Bracket in a Device.".

(Continued)

*Primary Examiner* — Tuan T Dinh
*Assistant Examiner* — Steven T Sawyer
(74) *Attorney, Agent, or Firm* — Finch & Maloney PLLC (57) ABSTRACT

Techniques for efficient routing of wires and electrical components within a device are disclosed. A wire can be routed, for example, in the space between two battery cells (or other components/structures) with the use of a bracket inserted between the cells to provide structural support. Electrical tape surrounding a battery may be breached to expose a cavity between distinct battery cells. In some embodiments, multiple brackets may be inserted between the cells, creating a trough through which a wire or other component may be routed. After routing a wire through the trough, another electrical part or housing may be fixed above the battery cells. One example case includes a first electrical component placed within the bracket, and a second electrical component routing in a divergent path to the first electrical component external to the bracket, wherein the first and second electrical component have a common start and end point.

18 Claims, 9 Drawing Sheets

(56) References Cited

U.S. PATENT DOCUMENTS

| | | | |
|---|---|---|---|
| 5,825,635 | A | 10/1998 | Mukoyama et al. |
| 6,160,702 | A | 12/2000 | Lee et al. |
| 6,259,019 | B1 | 7/2001 | Damilo |
| 6,844,105 | B1 | 1/2005 | Hanafusa et al. |
| 7,304,861 | B2 | 12/2007 | Takahashi |
| 8,017,264 | B2 | 9/2011 | Hong et al. |
| 8,025,997 | B2 | 9/2011 | Kim |
| 2002/0109971 | A1 | 8/2002 | Gilley |
| 2005/0069763 | A1 | 3/2005 | Hong |
| 2005/0079412 | A1 | 4/2005 | Kim |
| 2006/0166086 | A1 | 7/2006 | Kato |
| 2008/0081249 | A1 | 4/2008 | Kaneko |
| 2008/0113262 | A1 | 5/2008 | Phillips et al. |
| 2012/0009443 | A1 | 1/2012 | Baek |
| 2012/0231320 | A1 | 9/2012 | Heck et al. |
| 2012/0270074 | A1 | 10/2012 | Koh |
| 2012/0308849 | A1 | 12/2012 | Tortstensson et al. |
| 2014/0026411 | A1 | 1/2014 | Robertson et al. |
| 2014/0027166 | A1 | 1/2014 | Robertson et al. |
| 2014/0029218 | A1 | 1/2014 | Robertson et al. |
| 2014/0201996 | A1 | 7/2014 | Robertson et al. |
| 2014/0201997 | A1 | 7/2014 | Robertson et al. |

OTHER PUBLICATIONS

Robertson, et al., U.S. Appl. No. 13/749,273, filed Jan. 24, 2013, entitled, "Method for Split Wire Routing in a Cavity for a Device."

Non Final Office Action issued for U.S. Appl. No. 13/749,257. Mail date: Dec. 4, 2014, 19 pages.

Non-Final Office Action issued on U.S. Appl. No. 13/749,273. Mailed on Sep. 15, 2014. 14 pages.

Robertson, et al., U.S. Appl. No. 13/656,309, filed Oct. 19, 2012, entitled, "Techniques for Efficient Wire Routing in a Device,". Corresponding U.S. Publication No. 2014/0026411.

Robertson, et al., U.S. Appl. No. 13/946,545, filed Jul. 19, 2012, entitled, "Techniques for Efficient Wire Routing in Electronic Devices,". Corresponding U.S. Publication No. 201410027166.

Robertson, et al., U.S. Appl. No. 13/656,364, filed Oct. 19, 2012, entitled, "Apparatus for Efficient Wire Routing in a Device,". Corresponding U.S. Publication No. 2014/0029218.

Robertson, et al., U.S. Appl. No. 13/749,257, filed Jan. 24, 2013, entitled, "Techniques for Split Wire Routing for a Bracket in a Device,". Corresponding U.S. Publication No. 2014/0201996.

Robertson, et al., U.S. Appl. 13/749,273, filed Jan. 24, 2013, entitled, Method for Split Wire Routing in a Cavity for a Device, Corresponding U.S. Publication No. 2014/0201997.

Final Office Action issued on U.S. Appl. 13/749,273. Mailed on Mar. 26, 2015, 13 pages.

"Refilling laptop batteries With Some Tricks," dated Apr. 11, 2012, URL: http://www.brand-new-battery.com/blog/articles/refilling-laptop-batteries-with-some-tricks.htm. 7 pages.

Printout of "refilling" images, document created by the United States Patent Office Examiner on or about Mar. 24, 2014 in U.S. Appl. No. 13/749,273, received on Mar. 26, 2015. 13 pages.

Non Final Office Action issued for U.S. Appl. No. 13/656,309. Mail date: Jan. 2, 2015, 22 pages.

D1 "RazEr rEVolution: End Menial Labor", based on http://etotheipiplusone.net/?p=1020, Oct. 10, 2010, 27 pages.

D2 "Pre-Everything Updates", based on http://www.etotheipiplusone.net/?p=1521, Aug. 19, 2011, 20 pages.

* cited by examiner

Each line indicates multiple wires all taking the same path

Fig. 9
(Prior Art)

Split Wire Routing: Each line indicates multiple wires or a single wire taking divergent paths with the same start and end points Two    Fig. 10

Or more    Fig. 11

Each group can have a different length    Fig. 12

APPARATUS FOR SPLIT WIRE ROUTING IN A BRACKET FOR A DEVICE

RELATED APPLICATIONS

This application is related to U.S. application Ser. No. 13/656,309, filed Oct. 19, 2012, and titled "Techniques for Efficient Wire Routing in a Device". This application is herein incorporated by reference in its entirety.

This application is related to U.S. application Ser. No. 13/656,364 filed Oct. 19, 2012 and titled "Apparatus for Efficient Wire Routing in a Device" which is herein incorporated by reference in its entirety.

This application is related to U.S. application Ser. No. 61/675,122, filed Jul. 24, 2012, and titled "Apparatus for Efficient Wire Routing in a Device" which is herein incorporated by reference in its entirety.

This application is related to U.S. application Ser. No. 61/675,131 filed Jul. 24, 2012 and titled "Apparatus for Efficient Wire Routing in a Device" which is herein incorporated by reference in its entirety.

This application is related to U.S. application Ser. No. 61/675,136, filed Jul. 24, 2012, and titled "Method for Efficient Wire Routing in a Device" which is herein incorporated by reference in its entirety.

This application is related to U.S. application Ser. No. 61/675,140 filed Jul. 24, 2012 and titled "Method for Efficient Wire Routing in a Device" which is herein incorporated by reference in its entirety.

FIELD OF THE DISCLOSURE

The present disclosure relates to electrical wire routing, and more specifically to routing wires within compact electrical devices.

BACKGROUND

Typical electronic devices include a number of components populated on a printed circuit board (PCB) that has conductive runs electrically coupling various point of the circuitry. In some cases, additional wires are routed above the PCB to couple other points of the circuitry, such as those points that are not in direct contact with a contact pad of the PCB. Efficiently routing wires and other electrical elements within compact devices involves a number of non-trivial challenges.

Figure 8:
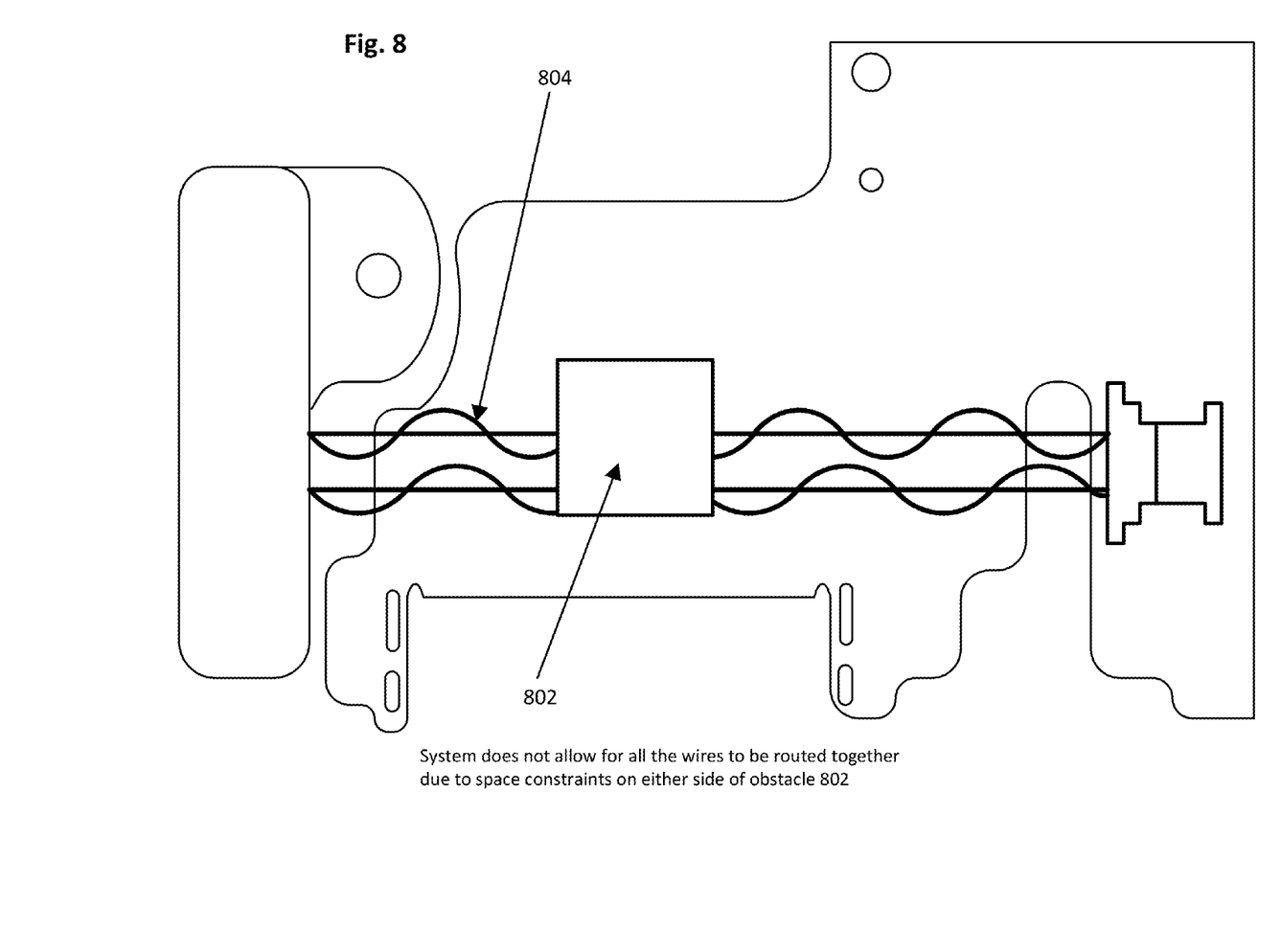
FIG. 8 depicts a limitation of the prior art.
Figure 9:
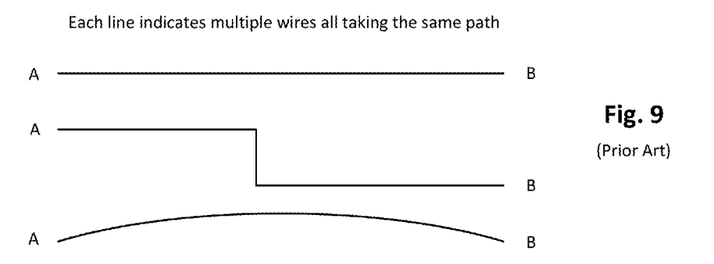
FIG. 9 depicts prior art solutions to the limitation depicted in FIG. 8.

One example of challenge of routing wires is depicted in FIG. 8. As can be seen, the example system does not allow for all the wires to be routed together due to space constraints on either side of an obstacle. In particular, the group of wires 804 is blocked by a component 802. Consequently, the group of wires would require rerouting around the component. Present solutions for wire routing between two points A and B are depicted in FIG. 9 that require the multiple wires to use the same path.

SUMMARY

One embodiment of the present invention provides an electrical device that includes a substrate, at least one electrical part in contact with the substrate, and a cavity neighboring the electrical part and above the substrate. The device further includes at least one bracket located within the cavity, and an electrical component placed within the bracket. In some cases, the at least one bracket is configured to provide structural integrity to the cavity without occupying all of the space within the cavity. In some cases, the at least one bracket extends the entire length of the cavity. In some cases, the at least one bracket extends only a portion of the length of the cavity. In some cases, the at least one bracket comprises two brackets located at the extremities of the cavity thereby leaving an unbracketed portion of the cavity. In some cases, the device further includes an insulating tape covering a substantial portion of the outside of the at least one electrical part. In some such cases, a portion of the insulating tape is located between the electrical part and a portion of the at least one bracket. In other such cases, a portion of the insulating tape covers a portion of the at least one bracket. In some cases, the substrate is a printed circuit board (PCB). In some cases, the at least one electrical part comprises a battery cell. In some cases, the at least one electrical part comprises at least two battery cells in contact with the substrate and the cavity is between the two battery cells. In some cases, the electrical component comprises at least one wire routed within the bracket. In some cases, the device further includes at least one of a housing and an electrical part covering a substantial portion of the at least one wire and at least one bracket.

Another embodiment of the present invention includes an electrical device. In this example embodiment, the device includes a printed circuit board (PCB), at least two battery cells in contact with the PCB, and a cavity with three or more boundaries comprising at least the PCB and one edge of each of the two battery cells. The device further includes at least one bracket located within the cavity, and at least one wire routed within the bracket. In some cases, the device further includes an insulating tape covering a substantial portion of the at least two battery cells. In some cases, the at least two battery cells are package in the insulating tape, and the insulating tape is breached to expose the cavity. In some cases, the at least one bracket is configured to form a substantially concave trough within the cavity. In some cases, the at least one bracket is configured to apply pressure against the boundaries of the cavity. In some cases, the at least one bracket is configured with two lips that cover a portion of each of the two battery cells.

Another embodiment of the present invention includes an electrical device. In this example embodiment, the device includes a printed circuit board (PCB), at least two battery cells in contact with the PCB, and a cavity with at least three boundaries comprising the PCB and one edge of each of the two battery cells, wherein the PCB and the at least two battery cells define a device footprint. The device further includes at least one bracket located within the cavity, wherein the at least one bracket is configured to overhang past the device footprint. The device further includes at least one wire routed within the cavity.

Figure 10:
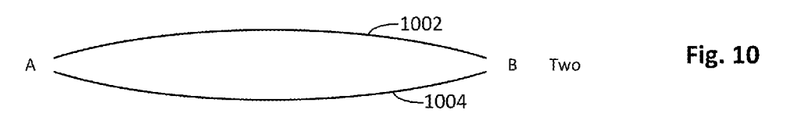
FIGS. 10, 11, and 12 represent split wire routing, in accordance with multiple embodiments of the present invention.
Figure 11:
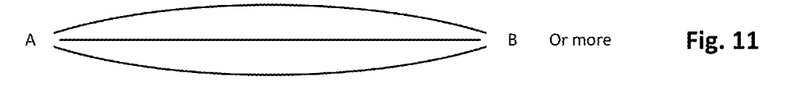
Figure 12:
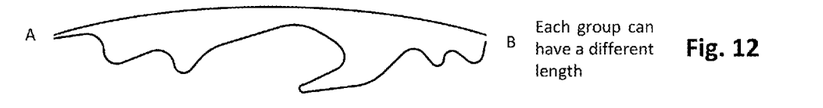

One embodiment of the present invention includes a split wire routing in a bracket for routing a plurality of wires in a group or a single wire in a group. This allows for each group to have the same start and end point but take divergent paths. Several embodiments of the novel wire routing are depicted in connection with FIGS. 10, 11, and 12. In one embodiment, each line 1002 in the FIGS. 10-12 represents a single wire. In another embodiment, each line 1002 in the FIGS. 10-12 represents a group of wires. As discussed previously, each embodiment allows each represent wire or group of wires (1002) to have the same start and end point that are represented by A and B, respectively.

The features and advantages described herein are not all-inclusive and, in particular, many additional features and advantages will be apparent to one of ordinary skill in the art in view of the drawings, specification, and claims. Moreover, it should be noted that the language used in the specification

DETAILED DESCRIPTION

Techniques for efficient routing of wires and electrical components within a device are disclosed. Electrical devices may have an insulating tape or coating surrounding all or a portion of the device. This tape may isolate cavities within the device that may be underutilized. For example, a Mylar® tape may cover two or more battery cells where there is an unused cavity between each of the cells. A wire can be routed, for example, in the space between the two battery cells with the use of a bracket inserted between the cells to provide structural support and electrical reliability, in accordance with an embodiment. The electrical tape surrounding the battery (or other component) may be cut in order to expose the cavity between distinct battery cells (or other components). In some specific embodiments, multiple brackets may be inserted between the battery cells at different locations along the cavity, creating a trough through which a wire or other component may be routed. After routing a wire through the trough, another electrical part or housing may be fixed to cover the battery cells, the brackets, and the routed wire/component.

General Overview

Figure 1:
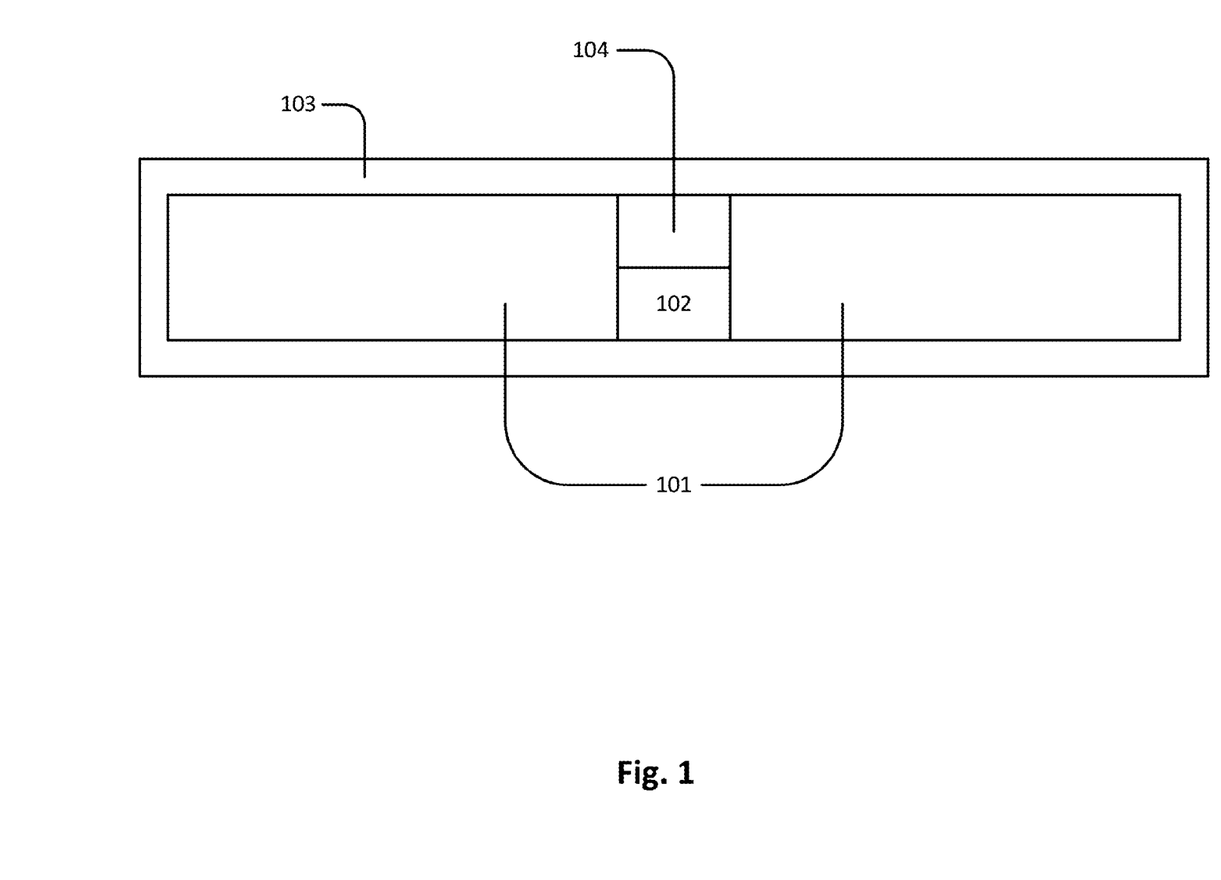
FIG. 1 shows a cross-sectional view of a circuit having two battery cells enclosed in an electrical tape.

As previously explained, efficiently routing wires and other electrical elements within compact devices involves a number of non-trivial challenges. For instance, electronic devices are present in various form factors, such as, tablets, cell phones, laptops, e-book readers, etc. One solution for routing wires or electrical components within an electrical device is to increase the gap between two electrical parts within the device so as to route the wire between the two parts. Unfortunately, this results in an increase in at least one dimension of the device footprint. FIG. 1 shows a cross-sectional view of two battery cells 101 with a printed circuit board (PCB) 102 between the battery cells, all surrounded by a Mylar® or other electrically insulating tape 103. The electrical tape 103 coating battery cells 101 and PCB 102 may leave an unused cavity 104 between the battery cells.

Thus, and in accordance with an embodiment of the present invention, techniques are disclosed for more effectively routing wires and other electrical components through electronic devices by exploiting underutilized space. According to one embodiment, the Mylar® tape surrounding battery cells may be removed or otherwise temporarily opened so as to expose the unused cavity between distinct battery cells. One or more brackets may then be inserted into the cavity to create structural stability within the cavity so that a wire may be routed through the cavity. The brackets effectively provide a trough, thereby allowing a wire to be routed through the trough within the bracket. The bracket also effectively contains the wire, which if placed directly in the cavity might, for instance, move under the battery cell and eventually cause a short-circuit or otherwise create a reliability problem. Note that embodiments other than wire routing between cells of a battery can also benefit from the techniques provided herein, as will be appreciated in light of this disclosure.

Device Design

Figure 2:
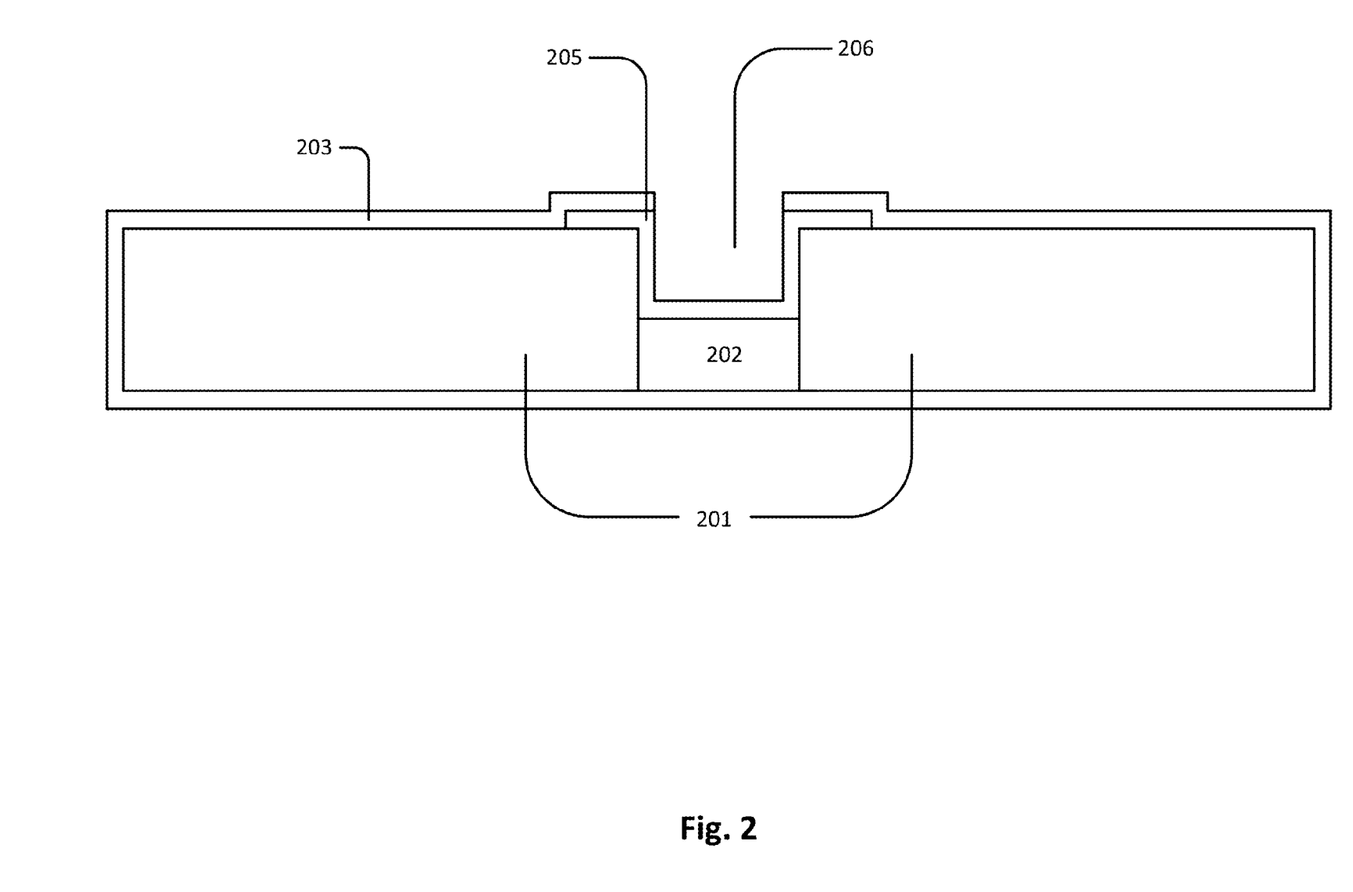
FIG. 2 shows a cross-sectional view of a circuit with a bracket inserted between battery cells, in accordance with one embodiment of the present invention.

FIG. 2 illustrates a cross-sectional view of an electrical device with a bracket 205 inserted between two cells 201 of a battery, according to one embodiment of the present invention. As can be seen, this particular example embodiment includes a PCB 202 located between the battery cells 201, and an electrical tape 203 covering a substantial portion of the device. The electrical tape may be made of Mylar®, for example, or some other suitable insulating material. The bracket 205 inserted between the battery cells creates a trough 206 that is structurally supported. The electrical tape 203 may initially coat all of, or a substantial portion of the electrical device, in which case the tape may be removed from the area where the bracket is to be placed, allowing the bracket to be inserted between the battery cells. In this particular example embodiment, the ends of electrical tape 203, once cut, may be repositioned above the bracket 205. Alternatively, the ends of tape 203 may be positioned below the lips of bracket 205, as discussed in further detail in reference to FIG. 3. The bracket 205 shown may be made, for example, of plastic and may provide structural support for the cavity 104 shown in FIG. 1. As will be further appreciated in light of this disclosure, bracket 205 helps maintain circuit reliability by containing the wire (or other component) routed therein. Multiple brackets of various sizes and dimensions may also be inserted into portions of the cavity between the battery cells. In other embodiments, one or more brackets may be inserted between other parts of an electrical device (other than battery cells) where such a bracket may be desirable for providing structural support for inserting a wire or other component in unused cavities within a device. Each battery cell or electrical part may include its own insulating layer to protect the device from undesired electrical contacts.

Figure 3:
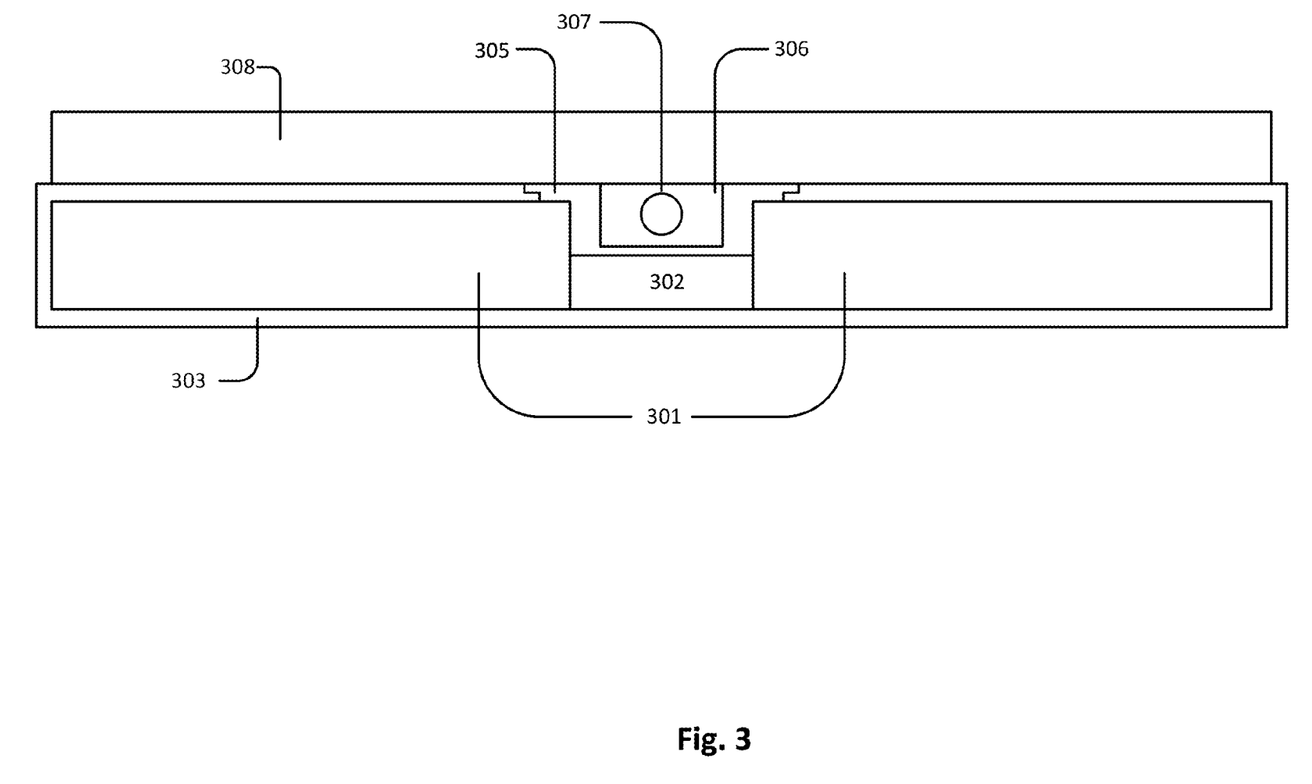
FIG. 3 shows a cross sectional view of a wire routed through a trough created by a bracket, in accordance with one embodiment of the present invention.

FIG. 3 illustrates a cross-sectional view of an electrical device with a wire routed between two cells of a battery, according to one embodiment of the present invention. This particular example embodiment includes a wire 307 routed within the trough 306 that is created by bracket 305 inserted in the cavity between battery cells 301. One or more brackets 305 may be inserted in the opening of electrical tape 303 and the brackets may be placed at different locations within the cavity between battery cells 301. In this particular example, the ends of electrical tap 303 are held in place against the battery cells 301 by the lips of bracket 305. After insertion of the brackets, a wire 307 may be placed in or more brackets within the trough 306. Depending on the size of the trough created by the brackets, multiple wires or other components may be routed using these techniques. In this example implementation, the bracket 305 is inserted above PCB 302 between the battery cells, and after routing of the wire 307 along a portion of the trough 306, another electrical part or housing 308 may be placed on top of the routed wire and bracket. The electrical part 308 may be, for example, a PCB, another battery cell, or any other electrical device. If desired, an electrical part 308 may include an electrical contact with a wire routed through the trough 306.

Multiple brackets of various sizes and dimensions may be inserted into portions of the cavity between the battery cells regardless of the dimensions of the cavity. The brackets inserted between the battery cells may have a degree of elasticity, such that they can fit tightly or snap into place between the cells. Such a tight fit may provide increased support for the trough as well as help hold the battery cells firmly in place so they do not compress against or otherwise contact the wire routed through the trough. This tight fit may also help keep the brackets themselves firmly in place between the battery cells. In other embodiments, one or more brackets may be inserted between other parts of an electrical device (other than battery cells) where such a bracket may be desirable for providing structural support for inserting a wire or other component in unused cavities within a device. The brackets may be shaped and configured as needed to utilize the available underutilized space regardless of the shape of the space or cavity.

FIG. 4a-4e show overhead views of various placements of one or more brackets between parts of an electrical device, in accordance with various embodiments of the present invention. In the particular embodiment shown in FIG. 4a, a single bracket 405 is inserted along the entire length of the cavity between the electrical parts 401. In one embodiment, the electrical parts 401 are two cells of a battery with the bracket located between them. A wire or other component may then be routed through the trough created by bracket 405. In the particular embodiment shown in FIG. 4b, one bracket 405 is inserted between the battery cells 401 to provide structural support and the bracket does not extend the entire length of the electrical device. This implementation leaves unbracketed cavities 406 between the battery cells, which may be acceptable in some applications. Is the particular embodiment shown in FIG. 4c, two brackets 405 are inserted on the edges of the electrical device between battery cells 401 leaving a structurally stable cavity 406 between the brackets. A wire may be routed through the cavities 406 and through the trough of one or more brackets 405. The positioning of brackets 405 between the battery cells 401 may be determined, among other factors, based on the sizes of the cells. As mentioned above, each battery cell or electrical part may include its own electrically insulating layer, such that electrical insulation is not a problem in the cavities 406 where a bracket is not present.

Figure 4A:
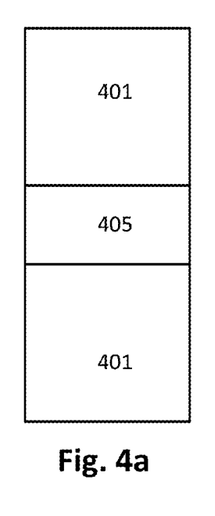
FIG. 4a shows an overhead view of a bracket inserted between two electrical parts, in accordance with one embodiment of the present invention.
Figures 4B, 4C:
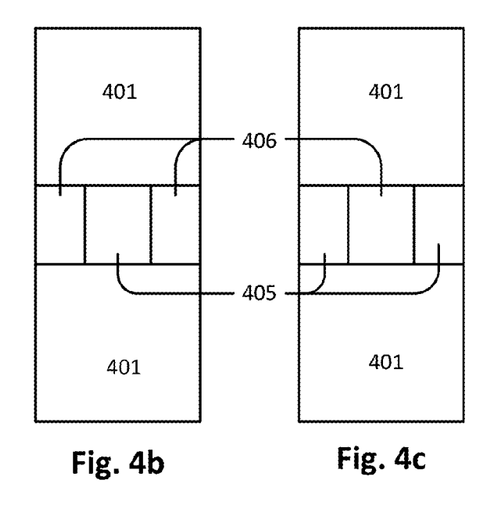
FIG. 4b shows an alternative overhead view of a bracket inserted between two electrical parts, in accordance with one embodiment of the present invention.
FIG. 4c shows an overhead view of two brackets inserted between two electrical parts, in accordance with one embodiment of the present invention.
Figure 4D:
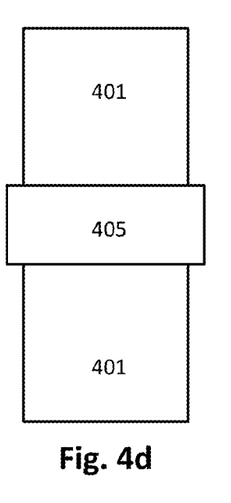
FIG. 4d shows an overhead view of a bracket inserted between two electrical parts where the bracket overhangs past the edge of the parts, in accordance with one embodiment of the present invention.
Figure 4E:
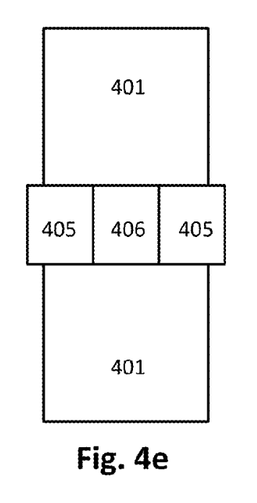
FIG. 4e shows an overhead view of two brackets inserted between two electrical parts where the brackets overhang past the edge of the parts, in accordance with one embodiment of the present invention.

FIGS. 4d and 4e show overhead views of various bracket placements where the brackets overhang beyond the edge of the electrical device. In FIG. 4d, a single bracket is inserted between battery cells 401 and extends the entire length of the electrical device and overhangs beyond the edges. In FIG. 4e, two brackets 405 are inserted on the edges of the electrical device between battery cells 401, and the brackets overhang beyond the edges of the device leaving an unbracketed cavity 406 between the two brackets. The overhang of the brackets may allow a wire that is routed within the trough created by the brackets to be easily connected to additional electrical devices that may be connected to the device shown in FIGS. 4a-4e, and without requiring an increase in the device footprint or existing layout. The various embodiments discussed are for illustration purposes only, and they are not intended to be an exhaustive list of bracket configurations. For instance, although the cavities illustrated in FIGS. 4a-4e are shown as single, continuous lines without junctions or bends, the cavities located between battery cells or other electrical parts may include curves, bends, multiple junctions, intersections of cavities, etc. The techniques disclosed herein are equally applicable to those implementations, and many alternative configurations will be apparent to those skilled in the art in light of this disclosure.

Figure 5:
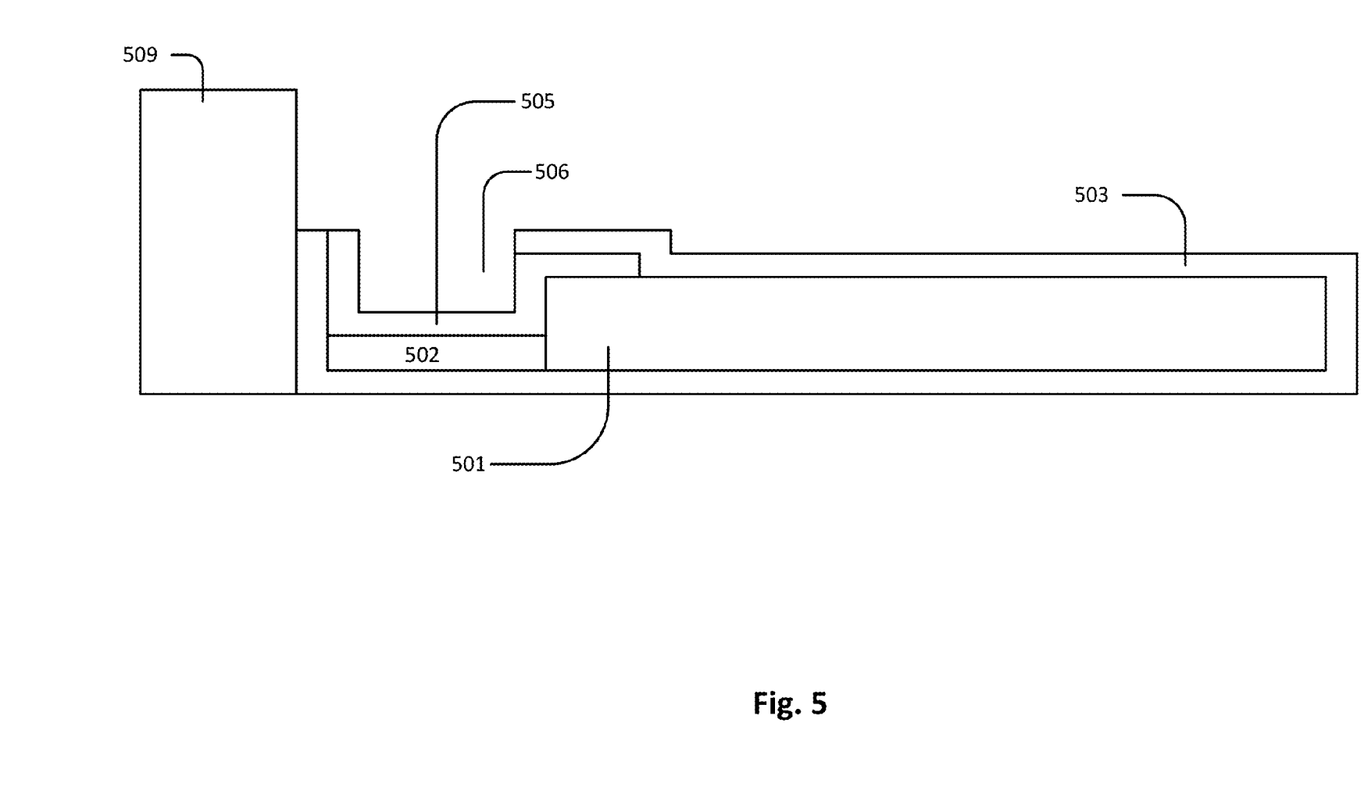
FIG. 5 shows a cross-sectional view of a bracket inserted between an electrical part and another structure, in accordance with one embodiment of the present invention.

FIG. 5 shows a cross-sectional view of an electrical device with a bracket inserted between a battery cell and a housing wall, according to one embodiment of the present invention. In this particular embodiment, the bracket 505 may be inserted between a battery cell 501 and housing or other structure 509 and above a PCB or substrate 502 to utilize space between the battery cell and the housing wall. In this example, the tape 503 around the electrical device may be altered or cut in order to expose the cavity above the PCB 502 and beside battery cell 501. The bracket may then be inserted within the cavity, forming a trough 506 that can be utilized for routing a wire or other component between the battery cell and housing wall. As illustrated in FIG. 5, the bracket in this implementation does not include an overlapping lip on both sides of the trough of the bracket. The brackets used for routing a wire in underutilized cavities within an electrical device may be of different shapes and configurations and may conform to whatever underutilized cavity space is available.

Figure 6A:
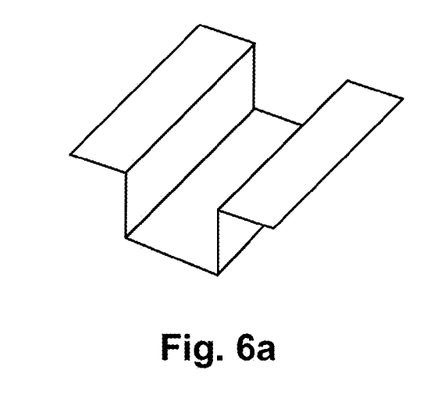
FIG. 6a shows an overhead, offset view of a bracket, in accordance with one embodiment of the present invention.
Figure 6B:
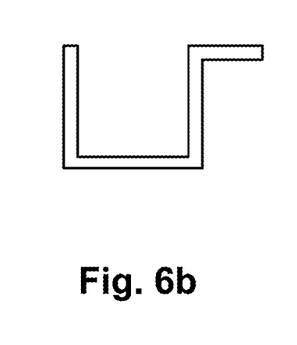
FIG. 6b shows a cross-sectional view of a bracket having one lip, in accordance with one embodiment of the present invention.
Figure 6C:
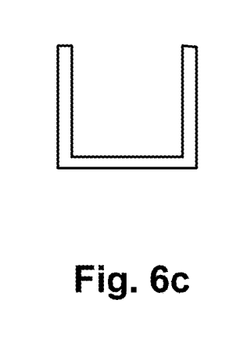
FIG. 6c shows a cross-sectional view of a bracket having no lip, in accordance with one embodiment of the present invention.
Figure 6D:
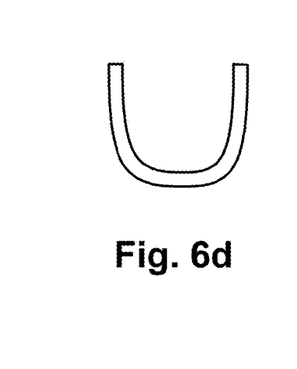
FIG. 6d shows a cross-sectional view of a bracket with a curved trough, in accordance with one embodiment of the present invention.
Figure 6E:
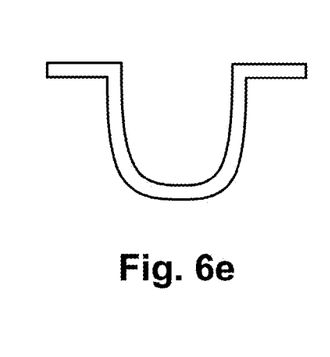
FIG. 6e shows a cross-sectional view of a bracket with a curved trough and two lips, in accordance with one embodiment of the present invention.
Figure 6F:
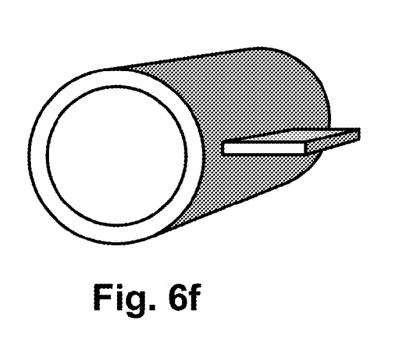
FIG. 6f shows a cross-sectional view of a bracket with a tube-like trough and optional lips, in accordance with one embodiment of the present invention.

FIGS. 6a-6e illustrate different bracket configurations, according to multiple embodiments of the present invention. FIG. 6a illustrates one embodiment of a bracket that may be inserted in the cavity between two electrical parts. The bracket includes a trough running along the length of the bracket and has two lips that may overhang over the neighboring electrical parts. FIG. 6b is a cross-sectional view of another bracket configuration having only one lip, as previously disclosed in reference to FIG. 5. FIG. 6c is a cross-sectional view of an alternative bracket configuration without any lips that may be inserted between two electrical parts in order to provide structural strength for wire routing. FIG. 6d is a cross-sectional view of another bracket configuration with a concave trough without lips that might overhang an electrical part. FIG. 6e is a cross-sectional view of yet another bracket configuration with a concave trough, having two lips that may be inserted between two electrical parts such that the lips cover a portion of the electrical parts. FIG. 6f is a cross-sectional view of yet another bracket configuration with a tube-like trough, which may also be configured with one or two lips if so desired. In some such cases, the tube may be a mesh like material, so as to allow visibility into the tube. The upper portions of the brackets shown in FIGS. 6d and 6e may be compressed together for easier insertion within the underutilized cavity space, and once inserted the bracket may expand creating a tight fit within the cavity space. Such a tight fit may provide increased support for the trough as well as help hold the electrical parts firmly in place so they do not compress against or otherwise contact the wire routed through the trough. This tight fit may also help keep the brackets themselves firmly in place between the electrical parts. The brackets shown in FIGS. 6a, 6b, 6e, and 6f may be inserted such that the lips may cover the ends of the electrical tape surrounding the electrical device, or the ends of the tape may lie over top of them. In other embodiments, the tape may lie over top of the bracket and substantially cover the bracket and trough, in a single wire routing; technique, multiple sizes and configurations of brackets may be used depending on the desired wire route. The brackets shown in the foregoing figures are not drawn to scale and many sizes and configurations will be apparent in light of this disclosure.

Methodology

Figure 7:
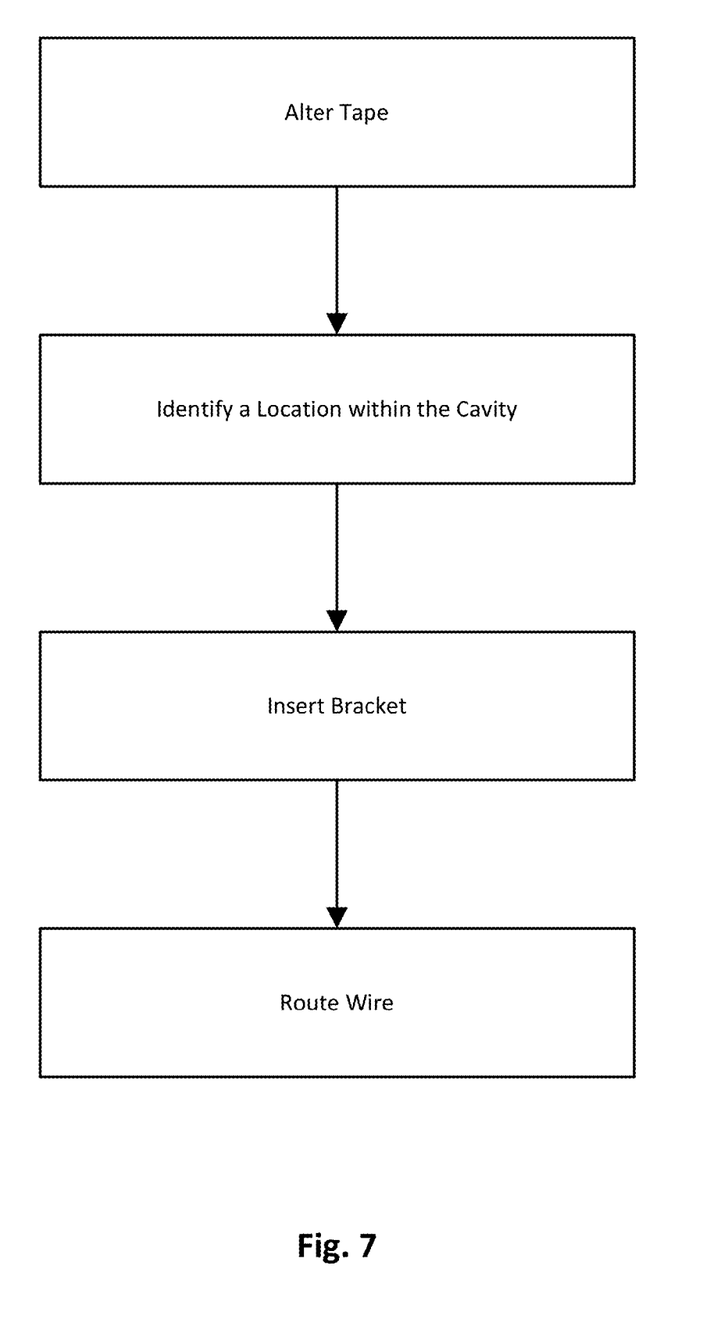
FIG. 7 shows a flow diagram of a method for routing a wire in an electrical device, in accordance with one embodiment of the present invention.

FIG. 7 is a flow diagram illustrating a method for routing a wire within a cavity in an electrical device, according to one embodiment of the present invention. Initially, the electrical device may be entirely or substantially covered in an electrical tape. In some embodiments this tape is made of Mylar®, or any other suitable insulating material. In order to access the underutilized cavities within the electrical device, the tape layer can be altered or cut. In an example embodiment, the tape is cut above the unused cavity between two battery cells in order to access the cavity. When the tape is altered, one or more locations within the cavity can be identified for placement of one or more brackets. The location of the bracket placement may be determined, among other factors, based on the size of the cavity, or the size of the electrical parts or battery cells around which a wire will be routed. In one example embodiment, the placement of the brackets may be determined before altering the electrical tape layer. The brackets may then be inserted into the desired locations within the cavity providing a structurally stable and/or electrically reliable path for wire routing. The brackets may also guide the wire or wires and prevent them from straying from their intended path. The brackets may be inserted such that, if they include a lip (as shown in FIGS. 6a, 6b, 6e, and 6f), the lip may overlap the ends of the electrical tape. Alternatively, the tape may be applied over the bracket after insertion. If desired, and adhesive material may be used to reapply the electrical tape around the electrical device, either above or underneath the brackets (or new tape may be provisioned). After bracket insertion, one or more wires or other components may be routed within the trough of the brackets. If the brackets do not extend the entire length of the cavity, the wire may pass through the troughs of one or more brackets and through the structurally stable cavities surrounding the brackets.

In one embodiment, each line 1002 in the FIGS. 10-12 represents a single wire. In another embodiment, each line 1002 in the FIGS. 10-12 represents a group of wires. As discussed previously, each embodiment allows each represent wire or group of wires (1002 and 1004) to have the same start and end point that are represented by A and B, respectively. In yet another embodiment, the line 1002 is routed through a cavity depicted in previous figures while allowing line 1004 to be routed without utilizing the cavity, but have the same start and end point that are represented by A and B.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An electrical device comprising:
    a substrate;
    at least one battery cell in contact with the substrate, the at least one battery cell having an insulating tape covering a portion of the outside of the at least one battery cell;
    a cavity neighboring the battery cell and above the substrate;
    at least one bracket located within the cavity;
    a first electrical component positioned within the at least one bracket; and
    a second electrical component routed in a divergent path to the first electrical component, the second electrical component being external to the bracket, wherein the first and second electrical component have a common start and end point.

2. The electrical device of claim 1, wherein the at least one bracket is configured to provide structural integrity to the cavity without occupying all of the space within the cavity.

3. The electrical device of claim 1, wherein the at least one bracket extends the entire length of the cavity.

4. The electrical device of claim 1, wherein the at least one bracket extends only a portion of the length of the cavity.

5. The electrical device of claim 1, wherein the at least one bracket comprises two brackets located at the extremities of the cavity thereby leaving an unbracketed portion of the cavity.

6. The electrical device of claim 1, wherein a portion of the insulating tape is located between the at least one battery cell and a portion of the at least one bracket.

7. The electrical device of claim 1, wherein a portion of the insulating tape covers a portion of the at least one bracket.

8. The electrical device of claim 1, wherein the substrate is a printed circuit board (PCB).

9. The electrical device of claim 1, wherein the at least one battery cell comprises two battery cells in contact with the substrate and the cavity is between the two battery cells.

10. The electrical device of claim 1, wherein the first electrical component comprises at least one wire routed within the at least one bracket.

11. The electrical device of claim 10, further comprising at least one of a housing and an electrical part covering a substantial portion of the at least one wire and at least one bracket.

12. An electrical device comprising:
    a printed circuit board (PCB);
    at least two battery cells in contact with the PCB;
    a cavity with three or more boundaries comprising at least the PCB and one edge of each of the two battery cells;
    at least one bracket located within the cavity; and
    at least a first wire routed within the at least one bracket, and a second wire routed external to the at least one bracket in a divergent path to the first wire, with a common start and end point for both the first and second wire.

13. The electrical device of claim 12, further comprising an insulating tape covering a substantial portion of the at least two battery cells.

14. The electrical device of claim 12, wherein the at least one bracket is configured to form a substantially concave trough within the cavity.

15. The electrical device of claim 12, wherein the at least one bracket is configured to apply pressure against the boundaries of the cavity.

16. The electrical device of claim 12, wherein the at least one bracket is configured with two lips that cover a portion of each of the two battery cells.

17. The electrical device of claim 13, wherein the at least two battery cells are packaged in the insulating tape, and the insulating tape is breached to expose the cavity.

18. An electrical device comprising:

a printed circuit board (PCB);

at least two battery cells in contact with the PCB;

a cavity with at least three boundaries comprising the PCB and one edge of each of the two battery cells, wherein the PCB and the at least two battery cells define a device footprint;

at least one bracket located within the cavity, wherein the at least one bracket is configured to overhang past the device footprint; and at least a first wire routed within the at least one bracket, and a second wire routed external to the at least one bracket in a divergent path to the first wire, with a common start and end point for both the first and second wire.

* * * * *